United States Patent [19]

Tamhankar et al.

[11] Patent Number: 5,302,412

[45] Date of Patent: Apr. 12, 1994

[54] SINGLE ATMOSPHERE FOR FIRING COMPATIBLE THICK FILM MATERIAL

[75] Inventors: Satish S. Tamhankar, Scotch Plains; Mark J. Kirschner, Morristown, both of N.J.

[73] Assignee: The BOC Group, Inc., Murray Hill, N.J.

[21] Appl. No.: 883,794

[22] Filed: May 14, 1992

Related U.S. Application Data

[60] Division of Ser. No. 640,540, Jan. 14, 1991, abandoned, which is a continuation of Ser. No. 306,429, Feb. 3, 1989, abandoned.

[51] Int. Cl.$^5$ .............................................. B05D 1/00
[52] U.S. Cl. .................................... 427/102; 427/101; 427/103; 427/123; 427/126.2
[58] Field of Search ............... 427/101, 102, 103, 123, 427/126.2

[56] References Cited

U.S. PATENT DOCUMENTS

| | | | |
|---|---|---|---|
| 3,726,006 | 4/1973 | Muckelroy | 29/846 |
| 3,978,248 | 8/1976 | Usami | 427/123 |
| 4,072,771 | 2/1978 | Grier | 427/126.2 |
| 4,234,367 | 11/1980 | Herron | 427/96 |
| 4,270,266 | 6/1981 | Lanzi | 427/123 |
| 4,322,316 | 3/1982 | Provance | 427/123 |
| 4,328,048 | 5/1982 | Senda | 427/123 |
| 4,355,054 | 10/1982 | Nagano | 427/126.2 |
| 4,485,153 | 11/1984 | Janikowski | 106/1.18 |
| 4,500,383 | 2/1985 | Kashiwagi | 427/126.2 |
| 4,503,090 | 3/1985 | Brown | 427/126.2 |
| 4,517,155 | 5/1985 | Prakash | 419/19 |
| 4,622,240 | 11/1986 | Yext | 427/102 |
| 4,766,027 | 8/1988 | Burn | 427/125 |
| 4,845,062 | 7/1989 | Burn | 501/138 |
| 4,994,436 | 2/1991 | Giacobbe | 505/1 |
| 5,059,450 | 10/1991 | Mellul | 427/96 |

FOREIGN PATENT DOCUMENTS 264088 4/1988 European Pat. Off.
2202676 9/1988 United Kingdom.

OTHER PUBLICATIONS

Yoshiara Kiichi, "Manufacture of Ceramic Circuit Substrate", Jul. 8, 1987, Patent Abstract of Japan, vol. 013-235.

F. Rotman et al., "Microstructures and Properties of Copper Thick-Film Fired Under Nitrogen Atmospheres Doped with Gaseous Oxidizers," IEEE/CHMT '89 Japan IEMT Symposium, CH2741-7/89/000-0255, at 255-258.

Edward A. Hayduk, Jr. & Bruce M. Adams, "Nitrogen-Nitrous Oxide: A Reactive Atmosphere for Copper Thick Film Processing," 10 International Journal for Hybrid Microelectronics, No. 4, at 14-20 (4th Quarter 1987) incomplete, p. 18 missing.

Gary S. Horne, "Improving Nitrogen Fireable Dielectric Performance Through Optimizing the Fire Process," The Multilayer Interconnect Board Technologies Workshop, Bloomington, Ind., 7 pp. (Jul. 21, 1988) incomplete pp. 2, 4, 6 missing.

*Primary Examiner*—Shrive P. Beck
*Assistant Examiner*—Vi Duong Dang
*Attorney, Agent, or Firm*—David M. Rosenblum; Larry R. Cassett

[57] ABSTRACT

The present invention provides an improved method for firing thick film inks in hybrid circuits which comprises firing different copper compatible thick film materials in a single firing atmosphere. The method comprises the steps of providing a paste suitable for application to a ceramic substrate, applying the paste to the substrate by a conventional technique such as screen printing, drying the substrate, and firing the substrate at an elevated temperature in an ambient comprising an inert gas and carbon dioxide to form the electrical component. In another embodiment, the substrate is fired in an ambient comprising only carbon dioxide.

5 Claims, No Drawings

SINGLE ATMOSPHERE FOR FIRING COMPATIBLE THICK FILM MATERIAL

This is a divisional of copending application Ser. No. 07/640,540 filed on 14 Jan. 1991 abandoned which is a continuation of Ser. No. 07/306,429 filed 3 Feb. 1989 (now abandoned).

The present invention pertains to an improvement in the field of hybrid circuit manufacturing. More particularly, this invention relates to an improved process for preparing ceramic hybrid circuits, which comprises firing different copper compatible thick film materials in a single firing atmosphere.

BACKGROUND OF THE INVENTION

Thick film hybrid circuits having high packing densities are well known in the art. Hybrid circuits are multi-level interconnected circuits consisting of a semiconductor or integrated circuit chip mounted on a ceramic insulator substrate. The circuit may be designed with termination pads for attaching semiconductor chips, connector leads, capacitors, resistors, and the like.

Thick film electrical components are made from inks or pastes formulated with organic solvents, binders and materials which will make the ink or paste either a conductor, a resistor, or a dielectric. The ink is screen printed in a selected pattern onto a nonconductive substrate, such as a ceramic or glass. The printed substrate is then dried to remove the organic solvent constituents contained in the paste and then the substrate is fired to sinter or fuse the inorganic constituents to bond the printed film to the substrate.

Precious metal conductor pastes are prepared from a noble metal, or combination of noble metals, such as gold, silver, platinum, palladium, iridium, rhodium, ruthenium, and osmium. Resistor paste materials are prepared from a variety of substances such as carbon, thallium, indium, ruthenium, and the like. Dielectric paste materials are prepared from materials such as glasses, ceramics, glazes and ferro-electric materials. Precious metal conductor, resistor, and dielectric materials are designed to be compatible with each other.

In a typical thick film firing process, the printed and dried ceramic substrate is passed through a multi-zone belt furnace. The speed of the belt is constant and the substrate progresses through heating zones of increasing temperature, typically up to about 700°–1000° C. The substrate is maintained at peak temperature for a predetermined period of time, generally about 5–15 minutes, after which it is cooled to ambient temperature. The zones in the furnace are commonly referred to as the burnout zone (with temperatures up to about 600° C.), the hot zone (the peak temperature) and the cooling zone (ambient temperature). The presence of an oxidizing atmosphere (air) during the firing process serves to promote the sintering and bonding processes which occur between the thick film and the substrate. The presence of an oxidizing atmosphere also serves to oxidize and remove the carbon-based vehicles which are present in the paste for the purpose of improving the rheological properties of the paste during the printing step. The organic vehicles are oxidized to volatile by-products such as carbon monoxide, carbon dioxide, and water vapor which are readily swept from the furnace by the exiting air atmosphere.

Hybrid circuits are generally built in three dimensional structures by employing multiple layers of electrical components. Dielectric insulating layers are placed between conductor layers to permit the conductors to cross over one another. The insulated overlapping conductor layers are interconnected through vias formed through the insulating layers and filled with conductor material. The vias are holes formed in individual ceramic insulator layers which are filled with conductor metal paste. After being sintered, the vias become dense conductor metal interconnections.

Base metals, such as copper, have been substituted for precious metals in the thick film conductor pastes because of their lower cost and better physical properties (solderability and conductivity). Because copper will be oxidized in an air atmosphere during a firing step, an inert or neutral atmosphere, such as nitrogen, must be employed during firing. The inert atmosphere, however, in addition to not oxidizing copper components, also will not oxidize and remove the carbon-based vehicles from the paste in an efficient manner. In the absence of an oxidizing agent in the firing atmosphere, a portion of the organic components may pyrolyze during the firing process.

Low levels of oxygen or other oxidizing agents have generally been added to the inert firing atmosphere to oxidize and remove the organic paste vehicles. In a typical copper compatible thick film process, the printed ceramic substrate is fired in a belt furnace under an atmosphere which is substantially inert (nitrogen) but which is doped with small amounts of an oxidizing agent (typically up to about 100 ppm oxygen) to react with the organic vehicle. The burnout zone in the belt furnace is generally where the organic vehicles are burned out and removed, i.e., the zone before the furnace reaches peak temperature. The addition of the oxidizing agent is restricted to the low temperature burnout zone. There must be good separation between zones since an appreciable quantity of oxygen leaking into zones having temperatures above about 600° C. will cause oxidation of the copper.

The use of an oxidizing dopant in an inert atmosphere during the thick film firing process has several disadvantages. The concentration of dopant in the inert firing atmosphere must be precisely controlled, and at such low concentration levels, such control is difficult. The oxidizing agent tends also to oxidize the copper conductor creating an adverse change in the electrical characteristics and soldering properties of the conductor because of the formation of copper oxide coatings. In addition, the carbon-based vehicles generally do not react efficiently with small amounts of oxygen present in the firing atmosphere and tend to form free carbon (soot) which can deposit on the walls and on the heating elements of the furnace, and on the substrate itself. Such deposits must periodically be removed adding to the cost of the operation. Carbon deposits on the substrate create an unacceptable appearance and can cause a defective circuit especially if the carbon deposit is between the layers of a multi-layer hybrid structure.

The use of conventional oxidizing dopants in an inert atmosphere during the thick film firing process has other significant disadvantages. Each conductor, resistor and dielectric component in the circuit usually has a different chemical composition and hence has a different chemical processing requirement in the atmosphere during the firing process. Each electrical component must usually be printed and fired separately adding additional cost to the procedure.

U.S. Pat. No. 4,234,367, issued to Herron et al. and assigned to International Business Machines Corporation, discloses a firing process for thick film circuitry of copper based conductors in an ambient of hydrogen and water vapor in a specified defined ratio followed by a sweep with an inert gas. The atmosphere is said to be reducing to copper but oxidizing to carbon.

U.S. Pat. No. 4,622,240, issued to Yext et al. and assigned to Air Products and Chemicals, Inc., discloses a firing process for copper based conductor thick film electrical components which involves using nitrous oxide as an oxidant in an inert atmosphere containing incidental amounts of water vapor.

Palanisamy et al. compared the thermodynamics for oxidation of copper and carbon based on the premise that pyrolysis or incomplete removal of the organic binders in the paste results in formation of carbon which must be removed by oxidation, Proceedings of the 1986 International Symposium on Microelectronics (ISHM), pp. 848-858. Palanisamy et al. considered the thermodynamics of mixtures of carbon monoxide-carbon dioxide and hydrogen-water vapor as reactive mixtures and concluded that the hydrogen-water vapor mixture was the superior dopant.

Thus, a number of methods are known to oxidize and remove carbon-based vehicles during the firing step in copper compatible thick film circuit forming processes. However, none of the methods is entirely satisfactory because each method requires very precise control of the concentration of the oxidizing dopant which is very difficult at such low levels. In addition, none of these methods provides a single firing atmosphere under which different electrical components, such as conductors, resistors, and dielectrics, can be fired at the same time. Accordingly, there is a need for an improved firing method in thick film forming processes which would efficiently oxidize and remove carbon-containing residues while maintaining reducing to neutral conditions for copper components. There is also a need for an improved process whereby different copper compatible thick film materials could be fired in a single atmosphere. Such a process could reduce the sensitivity of the conductor, resistor and dielectric materials to oxidants, improve the yield of the thick film forming process and reduce the cost of hybrid circuit manufacturing. The present invention provides such an improved process which allows the firing of different thick film components to be carried out in a single furnace atmosphere.

SUMMARY OF THE INVENTION

The present invention provides an improved method for firing thick film inks in hybrid circuits which comprises firing different copper compatible thick film materials in a single firing atmosphere. The method comprises the steps of providing a paste suitable for application to a hybrid circuit substrate, applying the paste to the substrate by conventional techniques, such as screen printing, drying the printed substrate, and firing the resulting substrate at an elevated temperature in an ambient comprising an inert gas and carbon dioxide to form the electrical component. In another embodiment, the substrate and paste are fired in an ambient comprising pure carbon dioxide.

DETAILED DESCRIPTION OF THE INVENTION

The present invention pertains to an improved process for firing thick film components in ceramic hybrid circuits. Moreover, the present invention provides a process for firing different copper compatible thick film materials in a single ambient atmosphere. In particular, the improved process comprises the steps of providing a paste suitable for application to a hybrid circuit substrate, applying the paste to the substrate by a conventional technique, such as screen printing, ink jet printing and the like, drying the printed substrate, and firing the substrate at an elevated temperature in an ambient comprising an inert gas and carbon dioxide to form the electrical component. In another embodiment, the substrate and paste are fired in an ambient comprising pure carbon dioxide.

Applicants have discovered that, when thick film materials are fired in an ambient comprising an inert gas and carbon dioxide as a dopant, or carbon dioxide alone, organic binder residues are efficiently oxidized and removed. The ambient firing atmosphere of the present invention provides the necessary oxidation potential for removing the organic binder residues from the furnace atmosphere without the adverse effect of oxidizing the copper-based components.

Furthermore, the ambient firing atmosphere of the present invention provides a single atmosphere compatible with the firing of different thick film materials, such as conductors, resistors and dielectrics. In addition to being compatible with the firing of a wide variety of different thick film materials, the firing atmosphere of the present invention is low in cost, is easy to use and control, has a wide window of operability and improves the desirable properties of the fired material.

In a preferred embodiment, the improved process for firing thick film components is conducted in an ambient which comprises an inert gas and, in percentages by volume, carbon dioxide in the range from about 0.5% to about 50%, more preferably from about 2% to about 25%, and most preferably from about 2% to about 5%.

In another embodiment, the improved process for firing thick film components is conducted in an ambient atmosphere which comprises pure carbon dioxide.

The inert (neutral) gases useful in the present invention are gases which do not react with the thick film components in the hybrid circuits. The particular inert gas may vary depending upon the particular thick film components employed. Suitable inert gases include nitrogen and the Noble gases and mixtures thereof. The preferred inert gases are nitrogen, argon, helium and mixtures thereof.

In a typical process for preparing a thick film electrical circuit, an electrical component is formed by selectively coating a suitable substrate by conventional technique, such as printing through a screen or mask, with a paste containing the desired electrical component, e.g. a conductor, a resistor, or a dielectric material. The organic solvent is removed during a drying process and the organic binder, which gives the film its strength, is removed at the beginning of the firing process at temperatures generally in the range from about 200° C. to about 600° C.

In the formulation of a thick film paste, the organic materials are generally added to the electrical component in an amount sufficient to obtain proper rheology for printing and to assure integrity of the printed film until it begins to sinter at high temperatures. Representative organic materials useful as binders in conventional paste formulations include various methacrylates, poly(vinyl butyrate), cellulose derivatives, such as ethylcellulose, and the like, and mixtures thereof. Representative organic materials useful as vehicles, i.e. solvents, include alpha-terpineol, butyl carbitol acetate, certain alcohols, acetone and the like, and mixtures thereof. The vehicle materials are substantially removed during the drying step of thick film preparation, generally at temperatures from about 100° to about 150° C., whereas the binder materials are removed in the burnout region of the firing furnace.

While the invention is not limited to theoretical considerations, it is believed that the organic vehicle used as part of the paste formulation must be removed from the multilayer film before the film begins to develop its characteristic microstructure and before the film reaches a temperature sufficiently high where residual carbon can be detrimental to the chemical stability of the film ingredients. Carbon dioxide is known to have high solubility in molten glass and is a good plasticizing agent with high permeability particularly for methacrylates which are often used as organic binders in thick film paste formulations. The presence of carbon dioxide in the ambient firing atmosphere is believed to improve the fluidity of the organic binder thereby permitting the binder residues to more easily escape from the film and be oxidized in the firing atmosphere.

The conductor paste coatings useful in the present invention are those coatings which are well known to the skilled artisan to possess desired processing properties, and are stable and compatible with integrated circuit processes. Conductor coatings are comprised of a conductor material and additives such as solvents, binding agents and the like. In general, the conductor materials useful in the conductor coatings include noble metals and base metals. Useful noble metals include gold, silver, platinum, palladium, iridium, rhodium, ruthenium, and osmium and mixtures thereof. Useful base metals include copper, nickel, aluminum and alloys thereof. Suitable copper conductor coatings include commercially available copper thick film conductor pastes, including substantially copper thick film conductor pastes, copper alloy thick film conductor pastes, and the like, and mixtures thereof. In addition to the conductor materials, the conductor coating may also contain reactive bonding agents, such as $Bi_2O_3$, PbO, and CdO. In a preferred embodiment, the conductor material is copper and alloys thereof.

The firing of thick film copper conductors and copper compatible resistor and dielectric systems requires rigorous control of the temperature profile to maintain the desired chemistry of the film. The temperature profile is critical to control the removal of organic binder, the rate of glass softening and the rate of liquid-phase sintering, and the development of the microstructure of the film.

The resistor paste coatings useful in the present invention are those coatings which are well known to the skilled artisan to possess desired processing properties, and are stable and compatible with integrated circuit processes. Resistor coatings are comprised of a resistor material and additives such as solvents, binding agents and the like. Suitable resistor materials include a variety of substances such as carbon, thallium, indium, ruthenium, and the like, and oxides thereof, and mixtures thereof. The desired level of resistance may be achieved by trimming the fired substrate containing the resistor coating with a laser or air abrasive.

The dielectric paste coatings useful in the present invention are those coatings which are well known to the skilled artisan to possess desired processing properties, and are stable and compatible with integrated circuit processes. Dielectric coatings are comprised of a dielectric material and additives such as solvents, binding agents and the like. Suitable dielectric materials useful in dielectric pastes include glasses, glazes and ferro-electric materials, such as oxides of aluminum, silicon, boron, calcium, strontium, magnesium, and zirconium, i.e., $Al_2O_3$, $SiO_2$, $B_2O_3$, CaO, SrO, MgO, $ZrO_2$, and the silicates of aluminum, boron, calcium, and lead, and the like, and mixtures thereof. The range of insulating property of the dielectric can be varied widely depending upon the particular application. Dielectrics are often used to build multi-layer circuits, capacitors and can be used as over-glazes to hermetically seal the entire circuitry to the ceramic substrate.

The nonconductive substrates useful in the present invention are hydrid circuit substrates which are well known to the skilled artisan to possess desired processing properties, and are stable and compatible with integrated circuit processes. Suitable nonconductive substrates in the present invention include porcelainized steel, glass, oxide and non-oxide ceramics such as 96% alumina, aluminum nitride, and the like, and mixtures thereof. In a preferred embodiment, the nonconductive substrate is 96% alumina.

The present invention is further illustrated by the following examples which are not intended to limit the effective scope of the claims.

EXAMPLES

In a typical example of a method for producing a thick film electrical component, the steps that were followed are as follows:

(a) a paste was provided suitable for application to a ceramic substrate;

(b) the paste was applied to the substrate by a conventional technique such as screen printing;

(c) the printed substrate was dried; and (d) the substrate and the paste were fired at an elevated temperature in an ambient comprising an inert gas and a dopant material to form the electrical component, with an appropriate temperature profile.

The electrical components in the following Examples were fired in a multi-zone belt furnace. The speed of the belt was constant and the substrate passed through discrete heating zones of increasing temperature, typically up to about 700°–1000° C. The substrate was maintained at maximum temperature for a predetermined period of time, generally about 5–15 minutes, after which period the substrate was cooled to ambient temperature. The burnout zone in the belt furnace is generally where the organic vehicles were burned out and removed, i.e., the zone before the furnace reaches peak temperature.

The composition of the majority of commercially available thick film resistors varies extensively. Therefore the following examples are directed mainly at methods for firing resistors to illustrate the compatibility of the ambient firing atmosphere of the present invention with a variety of materials used in commercially available resistors.

The compositions of most commercially available copper thick film conductors, on the other hand, are substantially identical to each other. Similarly, the compositions of most commercially available thick film dielectrics are substantially identical to each other with only minor differences existing in the additives included in the paste formulation. Hence, the process firing chemistry requirements do not differ substantially from one copper thick film conductor to another or from one dielectric material to another. The remaining examples therefore are directed at methods for firing commercially available resistors to illustrate the compatibility of the ambient firing atmosphere of the present invention with the different materials used in these electrical components.

EXAMPLES 1-6

These examples demonstrate a comparison of firing methods using different ambient atmospheres for firing different copper compatible thick film resistor materials in ceramic hybrid circuits.

Some of the major components used in commercially available resistors are shown below in Table 1:

TABLE 1

| Compositions And Resistance Ranges Of Some Commercially Available Resistors | | |
|---|---|---|
| Resistor | Resistance Range | Major Phases |
| DuPont (DL) Low Range | 10–1,000 ohm | Lanthanum Boride |
| DuPont (DH) High Range | 10,000–1,000,000 ohm | Tin Oxide Pyrochlore |
| Heraeus (HL) Low Range | 10–1,000 ohm | Barium Tantalum Pyrochlore |
| Heraeus (HH) High Range | 10,000–1,000,000 ohm | Strontium Ruthenate, doped |

The criteria for the successful firing of resistors includes obtaining the proper specific resistance values (resistivity, R, ohm/cm), the proper specific sheet resistance values (R, ohm/cm$^2$), and the lowest possible thermal coefficients of resistance (TCR, ppm/°C.) for the materials.

Table 2 shows for the commercially available resistor pastes fired in Examples 1-6, the design values of the sheet resistivities, R, and the thermal coefficients of resistance, TCR, both hot (+125° C.) and cold (/55° C.), of the resistors. The resistor pastes tested are identified in Table 1.

TABLE 2

| Resistor Designations And Specifications | | | |
|---|---|---|---|
| Resistor | Design Value of Sheet Resistivity (R, ohm/cm$^2$) | Hot TCR (+125° C.) (ppm/°C.) | Cold TCR (−55°C.) (ppm/°C.) |
| DL | 95.9 | +20 | +38 |
| DH | 116,000 | +55 | +124 |
| HL | 104.1 | +110 | +124 |
| HH | 100,000 | Not Specified | Not Specified |

Table 3 shows the dopant material employed in the ambient nitrogen atmosphere either in the burnout phase of the firing process or throughout the firing process in the firing methods of Examples 1-6. The average values of sheet resistance (R) and the thermal coefficients of resistance (TCR), hot and cold, obtained for the resistors prepared in the firing processes of Examples 1-6 are also given in Table 3.

All resistors fired in a 2% carbon dioxide doped nitrogen atmosphere gave sheet resistance and TCR values well within the generally recognized acceptability limits of plus/minus 150 ppm/°C. In specific cases, other doped atmospheres may give resistors having better sheet resistance and TCR values. For example, the Heraeus 100 Kohm resistors (HH) show superior resistivity values when fired in an ambient containing around 8000 ppm water in nitrogen in the burnout region. However, in that same ambient, the Heraeus 100 ohm resistor (HL) delaminated during the firing process. Hence the carbon dioxide doped atmosphere of the present invention was versatile, forgiving and compatible with the firing of resistors. Moreover, in most instances, those values obtained with carbon dioxide were the best among the dopants tested.

TABLE 3

| Average Values of Sheet Resistivity And Thermal Coefficients Of Resistance of Various Resistors As A Function Of Dopant Type In The Firing Atmosphere | | | | | | |
|---|---|---|---|---|---|---|
| | EXAMPLE | | | | | |
| Resistor | 1 No Dopant | 2 8000 ppm H$_2$O in burnout | 3 2000 ppm N$_2$O in burnout | 4 25 ppm O$_2$ in burnout | 5 2% CO$_2$ in burnout | 6 2% CO$_2$ throughout |
| DL | | | | | | |
| R, ohm/cm$^2$ TCR, ppm/°C. | 92.50 | 451.60 | 145.00 | 126.00 | 115.70 | 130.80 |
| Hot | 7.50 | −472.70 | −239.00 | −177.00 | −32.10 | −94.77 |
| Cold | 31.00 | −329.40 | −235.00 | −182.00 | −16.50 | −83.00 |
| DH | | | | | | |
| R, Kohm/cm$^2$ TCR, ppm/°C. | 184.00 | 145.70 | VHRM | VHRM | 181.36 | 180.38 |
| Hot | −35.80 | −44.80 | VHRM | VHRM | −29.60 | −33.44 |
| Cold | 90.50 | 53.40 | VHRM | VHRM | 64.30 | 68.47 |
| HL | | | | | | |
| R, ohm/cm$^2$ TCR, ppm/°C. | 84.00 | RL | 95.70 | 98.50 | 71.40 | 77.40 |
| Hot | 115.20 | RL | 87.00 | 89.00 | 117.38 | 103.72 |
| Cold | 132.20 | RL | 106.60 | 107.00 | 133.77 | 134.95 |
| HH | | | | | | |
| R, Kohm/cm$^2$ TCR, ppm/°C. | 118.00 | 103.50 | VHRG | VHRM | 136.00 | 142.60 |
| Hot | 64.20 | 26.60 | VHRG | VHRM | 21.56 | 45.57 |
| Cold | 118.40 | 73.40 | VHRG | VHRM | 80.17 | 93.20 |

RL = Resistors Delaminated
VHRM = Very High Resistance (in Megaohm range)
VHRG = Very High Resistance (in Gegaohm range)

EXAMPLES 7-9

These examples demonstrate a comparison of firing methods using different concentrations of carbon dioxide dopant (0.5%–25%) in an ambient nitrogen atmosphere for firing different copper compatible thick film resistor materials in ceramic hybrid circuits.

Table 4 shows the concentration of carbon dioxide dopant material employed (0.5%, 2%, and 25%) in the ambient nitrogen atmosphere in the burnout phase of the firing process in the methods of Examples 7-9. The average values of sheet resistance (R) and the thermal coefficients of resistance (TCR) obtained for the resistors prepared in these firing processes are also given in Table 4.

All resistors fired in the carbon dioxide doped nitrogen atmosphere gave sheet resistance and TCR values well within the generally recognized acceptability limits of plus/minus 150 ppm/°C. The DuPont lanthanum boride resistors gave better sheet resistance and TCR values when fired in atmospheres containing lower carbon dioxide concentrations in nitrogen while the Heraeus barium tantalum pyrochlore and strontium ruthenate, doped resistors gave better sheet resistance and TCR values when fired in atmospheres containing higher carbon dioxide concentrations. Hence the carbon dioxide doped atmosphere of the present invention was compatible with the firing of resistors.

TABLE 4

Average Values of Sheet Resistivity and Thermal Coefficients of Resistance of Various Resistors As A Function Of Carbon Dioxide Concentration In The Firing Atmosphere

| Resistor | 0.5% $CO_2$ | 2% $CO_2$ | 25% $CO_2$ |
|---|---|---|---|
| DL | | | |
| R, ohm/$cm^2$ | 103.13 | 115.70 | 177.4 |
| TCR, ppm/°C. | | | |
| Hot | −15.01 | −32.10 | −129.18 |
| Cold | +2.02 | −16.50 | −120.73 |
| DH | | | |
| R, Kilo ohm/$cm^2$ | 203.40 | 181.36 | 173.64 |
| TCR, ppm/°C. | | | |
| Hot | −53.70 | −29.60 | −65.95 |
| Cold | +44.44 | +64.30 | +35.21 |
| HL | | | |
| R, ohm/$cm^2$ | 83.20 | 71.40 | 77.90 |
| TCR, ppm/°C. | | | |
| Hot | +108.12 | +117.38 | +107.67 |
| Cold | +137.66 | +133.77 | +121.84 |
| HH | | | |
| R, Kilo ohm/$cm^2$ | 134.12 | 136.00 | 160.40 |
| TCR, ppm/°C. | | | |
| Hot | +31.73 | +21.56 | +7.40 |
| Cold | +90.64 | +80.17 | +62.85 |

EXAMPLES 10-16

These examples demonstrate a comparison of firing methods using different concentrations of carbon dioxide dopant (0%-100%) in an ambient nitrogen atmosphere for firing two different copper compatible thick film resistor materials (Dupont lanthanum boride and tin oxide pyrochlore resistors) in ceramic hybrid circuits.

Table 5 shows the concentration of the carbon dioxide dopant material employed (0%, 0.5%, 2.25%, 10%, 25%, and 100%) in the ambient nitrogen atmosphere either in the burnout zone of the firing process or throughout the firing process in the methods of Examples 10-16. The average values of sheet resistance (R) and the thermal coefficients of resistance (TCR) obtained for the resistors prepared in the firing processes of Examples 10-16 are also given in Table 5.

The two resistors responded differently to the carbon dioxide doped atmospheres because of their different chemical compositions. Most resistivity and TCR values for the two resistors are well within the generally recognized acceptability limits. Both resistors gave resistivity values acceptable in all cases when fired in an atmosphere of 10% carbon dioxide in nitrogen throughout the furnace. Hence the carbon dioxide doped atmosphere of the present invention was compatible with the firing of resistors.

The DuPont DH resistor gave TCR values within an acceptable range even when fired in an atmosphere of 100% carbon dioxide. The other DuPont resistor, DL, showed a large increase in resistivity value when fired in an atmosphere of 100% carbon dioxide.

TABLE 5

Average Values of Sheet Resistivity and Thermal Coefficients of Resistance of Various Resistors As A Function Of Carbon Dioxide Concentration In The Firing Atmosphere

| | EXAMPLE | | | | | | |
|---|---|---|---|---|---|---|---|
| | 10 | 11 | 12 | 13 | 14 | 15 | 16 |
| Resistor | 0% $CO_2$ throughout | 0.5% $Co_2$ in burnout | 2.25% $CO_2$ in burnout | 2.25% $CO_2$ throughout | 10% $CO_2$ throughout | 25% $CO_2$ in burnout | 100% $CO_2$ throughout |
| DuPont DL 100 Ohm Resistor | | | | | | | |
| Resistivity (ohm/$cm^2$) | 90 | 101 | 118 | 129 | 150 | 175 | high |
| Coefficient of Variation, % | 3.0 | 5.6 | 4.5 | 5.5 | — | 4.4 | — |
| Hot TCR (125° C.), ppm/°C. | +7.5 | −15 | −32 | −95 | −188 | −129 | — |
| Cold TCR (−55° C.), ppm/°C. | +31 | +2 | −16.5 | −83 | −174 | −121 | — |
| Resistivity Kilo ohm/$cm^2$ | 180 | 197 | 178 | 177 | 144 | 170 | 111 |
| Coefficient of Variation, % | 8.3 | 7.9 | 5.0 | 5.0 | 4.0 | 6.0 | 4.0 |
| Hot TCR (125° C.), ppm/°C. | −36 | −54 | −30 | −33 | −78 | −66 | −178 |
| Cold TCR (−55° C.), ppm/°C. | +90.5 | +44 | +64 | +68 | +18 | +35 | −86 |

These examples illustrate the versatility of carbon dioxide in adjusting the resistivity and TCR values of a given resistor to obtain desired performance.

EXAMPLES 17-23

These examples demonstrate a comparison of firing methods using different concentrations of carbon dioxide dopant (0%-100%) in an ambient nitrogen atmosphere for firing two different copper compatible thick film resistor materials (Heraeus barium tantalum pyrochlore and strontium ruthenate, doped resistors) in ceramic hybrid circuits.

Table 6 shows the concentration of the carbon dioxide dopant material employed (0%, 0.5%, 2.25%, 10%, 25%, and 100%) in the ambient nitrogen atmosphere either in the burnout phase of the firing process or throughout the firing process in the methods of Examples 17-23. The average values of sheet resistance (R) and the thermal coefficients of resistance (TCR) obtained for the resistors prepared in the firing processes of Examples 17-23 are also shown in Table 6.

The two resistors responded differently to the carbon dioxide doped atmospheres because of their different chemical compositions. Most resistivity and TCR values for the two resistors are well within the generally recognized acceptability limits. Both resistors gave resistivity values acceptable in all cases when fired in an atmosphere of 10% carbon dioxide in nitrogen throughout the furnace. Hence the carbon dioxide doped atmosphere of the present invention was compatible with the firing of resistors.

The Heraeus resistors (HL and HH) showed a large increase in resistivity value when fired in an atmosphere of 100% carbon dioxide.

TABLE 6

Average Values of Sheet Resistivity and Thermal Coefficients of Resistance of Various Resistors As A Function Of Carbon Dioxide Concentration In The Firing Atmosphere

| | EXAMPLE | | | | | | |
|---|---|---|---|---|---|---|---|
| | 17 | 18 | 19 | 20 | 21 | 22 | 23 |
| | 0% $CO_2$ | 0.5% $CO_2$ | 2.25% $CO_2$ | 2.25% $CO_2$ | 10% $CO_2$ | 25% $CO_2$ | 100% $CO_2$ |
| Resistor | throughout | in burnout | in burnout | throughout | throughout | in burnout | throughout |
| Heraeus HL 100 Ohm Resistor | | | | | | | |
| Resistivity (ohm/$cm^2$) | 81 | 80 | 69 | 74 | 135 | 76.5 | high |
| Coefficient of Variation, % | 4.8 | 3.5 | 3.5 | 3.0 | 6.0 | 7.0 | — |
| Hot TCR (125° C.), ppm/°C. | +115 | +108 | +117 | +104 | +78 | +108 | — |
| Cold TCR (−55° C.), ppm/°C. | +132 | +138 | +134 | +135 | +90 | +122 | — |
| Resistivity kilo ohm/$cm^2$ | 117 | 130 | 132 | 139 | 153 | 155 | high |
| Coefficient of Variation, % | 4.0 | 5.5 | 3.0 | 7.3 | 3.0 | 8.0 | — |
| Hot TCR (125° C.), ppm/°C. | +64 | +32 | +22 | +46 | +31 | +7.5 | — |
| Cold TCR (−55° C.), ppm/°C. | +118 | +91 | +80 | +93 | +77 | +53 | — |

TABLE 7

Average Values of Copper Adhesion Tests Of Conductors As A Function Of Dopant Type In The Firing Atmosphere

| EXAMPLE | DOPANT | TEST | AVERAGE PULL STRENGTH* | STANDARD DEVIATION | COEFFICIENT OF VARIATION |
|---|---|---|---|---|---|
| 24 | None | Initial | 2.90 | 0.37 | 12.76 |
| | | Aged | 2.43 | 0.21 | 8.50 |
| 25 | 25 ppm $O_2$ | Initial | 2.36 | 0.29 | 12.46 |
| | | Aged | 2.13 | 0.30 | 13.97 |
| 26 | 1.25% $H_2O$ | Initial | 2.69 | 0.20 | 7.28 |
| | | Aged | 2.52 | 0.33 | 12.90 |
| 27 | 2% $CO_2$ | Initial | 2.93 | 0.30 | 10.35 |
| | | Aged | 2.53 | 0.34 | 13.38 |

*Kilograms per 80 mil × 80 mil pad

EXAMPLES 24–27

These examples demonstrate a comparison of firing methods using different types of dopants in a nitrogen ambient atmosphere for firing copper compatible thick film conductor materials in ceramic hybrid circuits.

Table 7 shows the type and concentration of dopant material employed in the ambient nitrogen atmosphere in the burnout phase of the firing processes of Examples 24–27. The average copper adhesion pull strength (kilograms per 80 mil × 80 mil pad), the standard deviation and the coefficient of variation obtained for the conductors prepared in the firing processes of Examples 24–27 are also shown in Table 7.

Initial and aged (168 hours at 150° C.) adhesion test values obtained for the conductors showed no great sensitivity of the conductor to any of the doped firing atmospheres. The conductors fired in a carbon dioxide doped nitrogen atmosphere showed the highest adhesion strength.

In addition to the above examples, other runs showed that no copper oxidation was observed in conductors fired in atmospheres containing 25% carbon dioxide dopant in nitrogen. Copper pads fired in a 100% carbon dioxide atmosphere also did not show significant oxidation and were solderable. Hence the carbon dioxide doped atmosphere of the present invention was compatible with the firing of conductors.

EXAMPLES 28–33

These examples demonstrate a comparison of firing methods using different types of dopants in a nitrogen ambient atmosphere for firing copper compatible thick film dielectric materials in ceramic hybrid circuits.

Table 8 shows the type and concentration of dopant material employed in the ambient nitrogen atmosphere in either the burnout phase of the firing process or throughout the firing process in the methods of Examples 28–33. Firing runs were made on a DuPont 4575 dielectric in a nitrogen ambient atmosphere containing water ($H_2O$) or various concentrations of carbon dioxide ($CO_2$) as dopants for comparison purposes. The results of current leakage tests and the coefficients of variation obtained on the dielectrics prepared in the firing processes in Examples 28–33 are shown in Table 8.

The current leakage values observed for the DuPont 4575 dielectric fired in a carbon dioxide-doped atmosphere were well within generally recognized acceptability limits. Moreover, the use of carbon dioxide in the firing atmosphere as a dopant reduced current leakage in the resulting dielectric significantly. Hence the firing method in the doped atmosphere of the present invention is compatible with dielectrics.

These examples illustrate that, in the event only copper and dielectric inks are being fired, a furnace atmosphere of 100% carbon dioxide provides optimum results.

TABLE 8

Average Values Of Current Leakage In Dielectrics
As A Function of Dopant Type In The Firing Atmosphere

| | EXAMPLE | | | | | |
|---|---|---|---|---|---|---|
| Dopant | 28 No Dopant | 29 8000 ppm $H_2O$ throughout | 30 2.25% $CO_2$ in burnout | 31 2.25% $CO_2$ throughout | 32 10% $CO_2$ throughout | 33 100% $CO_2$ throughout |
| Average Current Leakage, microamperes/$cm^2$ | 447 | 407 | 255 | 248 | 264 | 165 |
| Coefficient of Variation, % | 16 | 21 | 18 | 16.5 | 15.4 | 16 |

Accordingly, the carbon dioxide doped atmosphere of the present invention is compatible with the firing of conductors, resistors and dielectrics.

The invention being thus described, it will be obvious that the same may be varied in many ways. Such variations are not to be regarded as a departure from the spirit and scope of the invention and all such modifications are intended to be included within the scope of the following claims.

We claim:

1. In a method of producing a thick film hybrid circuit containing multiple layers of electrical components and formed by separately applying thick film pastes to a hybrid circuit substrate and after application of each of the thick film pastes, drying and then, in a furnace, firing each of the thick film pastes; the thick film pastes having, an organic solvent, an organic binder, and different thick film materials selected from the group consisting of conductor material resistor material, dielectric material; and the furnace having a burnout section to remove the organic binder, a firing section to sinter the thick film materials and a cooling section to cool the hybrid circuit substrate; the improvement comprising introducing the hybrid circuit substrate and each of the thick film pastes into the furnace while introducing a single firing atmosphere into at least the burnout section of the furnace, wherein the single firing atmosphere is the same for each of the thick film pastes and the thick film pastes have thick film materials comprising one of a base metal conductor, a base metal compatible resistor, and a base metal compatible dielectric and wherein the single firing atmosphere is carbon dioxide, an inert gas doped with carbon dioxide, or a mixture of inert gases doped with carbon dioxide so that the single firing atmosphere will be compatible with all of the thick film materials.

2. The improvement of claim 1, wherein the single firing atmosphere is introduced into the burnout, firing, and cooling sections of the furnace.

3. The improvement of claim 1, wherein carbon dioxide is present in the inert gas doped with carbon dioxide and the mixture of the inert gases doped with carbon dioxide in a range from about 0.5% and about 50.0% by volume.

4. The improvement of claim 1, wherein carbon dioxide is present in the inert gas doped with carbon dioxide and the mixture of the inert gases doped with carbon dioxide in a range from about 0.2% and about 25.0% by volume.

5. The improvement of claim 1, wherein carbon dioxide is present in the inert gas doped with carbon dioxide and the mixture of the inert gases doped with carbon dioxide in a range from about 2.0% and about 5.0% by volume.

* * * * *